United States Patent
Sato et al.

(10) Patent No.: US 9,299,772 B2
(45) Date of Patent: Mar. 29, 2016

(54) SEMICONDUCTOR DEVICE

(71) Applicant: Renesas Electronics Corporation, Kanagawa (JP)

(72) Inventors: Yoshiyuki Sato, Kanagawa (JP); Yasutaka Nakashiba, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/715,641

(22) Filed: May 19, 2015

(65) Prior Publication Data

US 2015/0357404 A1 Dec. 10, 2015

(30) Foreign Application Priority Data

Jun. 5, 2014 (JP) ................. 2014-116435

(51) Int. Cl.

| | |
|---|---|
| *H01L 27/088* | (2006.01) |
| *H01L 29/06* | (2006.01) |
| *H01L 29/78* | (2006.01) |
| *H01L 29/10* | (2006.01) |
| H01L 23/528 | (2006.01) |

(52) U.S. Cl.
CPC .......... *H01L 29/063* (2013.01); *H01L 29/1095* (2013.01); *H01L 29/7816* (2013.01); *H01L 23/528* (2013.01)

(58) Field of Classification Search
CPC .............. H01L 29/063; H01L 29/7816; H01L 29/1095; H01L 23/528
USPC ......................................................... 257/401
See application file for complete search history.

(56) References Cited

U.S. PATENT DOCUMENTS

2005/0012153 A1* 1/2005 Ipposhi .................. H01L 21/84
257/347

FOREIGN PATENT DOCUMENTS

| JP | 7-263547 A | 10/1995 |
|---|---|---|
| JP | 2010-16153 A | 1/2010 |
| JP | 2012-39029 A | 2/2012 |

* cited by examiner

*Primary Examiner* — Nicholas Tobergte
(74) *Attorney, Agent, or Firm* — Mattingly & Malur, P.C.

(57) ABSTRACT

A semiconductor device in which the concentration of an electric field is suppressed in a region overriding a drain region and a source region. A drain region is formed in a first region, a source region is formed in a second region. A field oxide film surrounds the first region in a plan view. A metal interconnect situated over a field oxide film. The metal interconnect formed of a metal having an electric resistivity at 25° C. of 40 μΩ·cm or more and 200 μΩ·cm or less. Further, the metal interconnect is repeatedly provided spirally in a direction along the edges of the first region. Further, the metal interconnect is electrically connected at the innermost circumference with the drain region, and is connected at the outermost circumference to the source region or a ground potential.

12 Claims, 17 Drawing Sheets

SEMICONDUCTOR DEVICE

CROSS-REFERENCE TO RELATED APPLICATIONS

The disclosure of Japanese Patent Application No. 2014-116435 filed on Jun. 5, 2014 including the specification, drawings and abstract is incorporated herein by reference in its entirety.

BACKGROUND

The present invention relates to a semiconductor device which provides a technique applicable, for example, to power devices.

In the power devices, a lateral reduced surface field (RESURF) transistor is sometimes used as described, for example, in Japanese Unexamined Patent Application Publication No. 2012-39029. Such transistor has a field oxide film between a drain region and a source region. In the transistor described above, a high voltage is applied between the drain region and the source region. The field oxide film is provided for improving a withstand voltage between the drain region and the source region.

Japanese Unexamined Patent Application Publication No. 2010-16153 describes an LDMOS (Laterally-Diffused Metal Oxide Semiconductor) as the power device. In Japanese Unexamined Patent Application Publication No. 2010-16153, LDMOS and CMOS (Complementary MOS) are hybridized over an identical semiconductor substrate.

Japanese Unexamined Patent Application Publication No. Hei07(1995)-263547 describes that a PSG (Phospho Silicate Glass) film and a silicon nitride film are stacked in this order over an aluminum interconnect.

SUMMARY

In the transistor exemplified as an RESURF transistor and used for the power device, a high voltage is applied between a drain region and a source region. In this case, an electric field is sometimes concentrated to a portion of a region overriding the drain region and the source region. The concentration of the electric field sometimes gives an undesired effect on the characteristics of the transistor. Then, the present inventors have studied a new structure for suppressing the concentration of the electric field. Other subjects and novel features will become apparent in view of the descriptions of the present specification and the appended drawings.

According to a preferred embodiment, a drain region is formed in a first region and a source region is formed in a second region. A field insulation film surrounds the first region in a plan view. A metal interconnect is situated over the field insulation film. The metal interconnect is formed of a metal having an electric resistivity at 25° C. of 40 µΩ·cm or more and 200 µΩ·cm or less. Further, the metal interconnect is provided repeatedly while being turned-back or spirally in the direction along the edges of the first region. The metal interconnect is electrically connected at the innermost circumference with the drain region and electrically connected at the outermost circumference with the source region or a ground potential.

According to another embodiment, the metal interconnect is situated by way of an interlayer dielectric film over the field insulation film. A first metal electrode is situated on the side of the first region in contrast to the metal interconnect in a plan view and covers the interlayer dielectric film. The first metal electrode is electrically connected with the drain region. In the same manner, a second metal electrode is situated on the side of the second region in contrast to the metal interconnect in the plan view and covers the interlayer dielectric film. The second metal electrode is electrically connected with the source region. A barrier metal film is formed along the bottom of the first metal electrode and the bottom of the second metal electrode. The metal interconnect is formed of a material identical with that of the barrier metal film.

According to another embodiment, an anti-reflection film covers the first metal electrode and the second metal electrode described above. The anti-reflection film is a metal film. The metal interconnect is formed of a material identical with that of the anti-reflection film.

According to the embodiment, concentration of the electric field in a region overriding the drain region and the source region can be suppressed.

DETAILED DESCRIPTION

Figure 1:
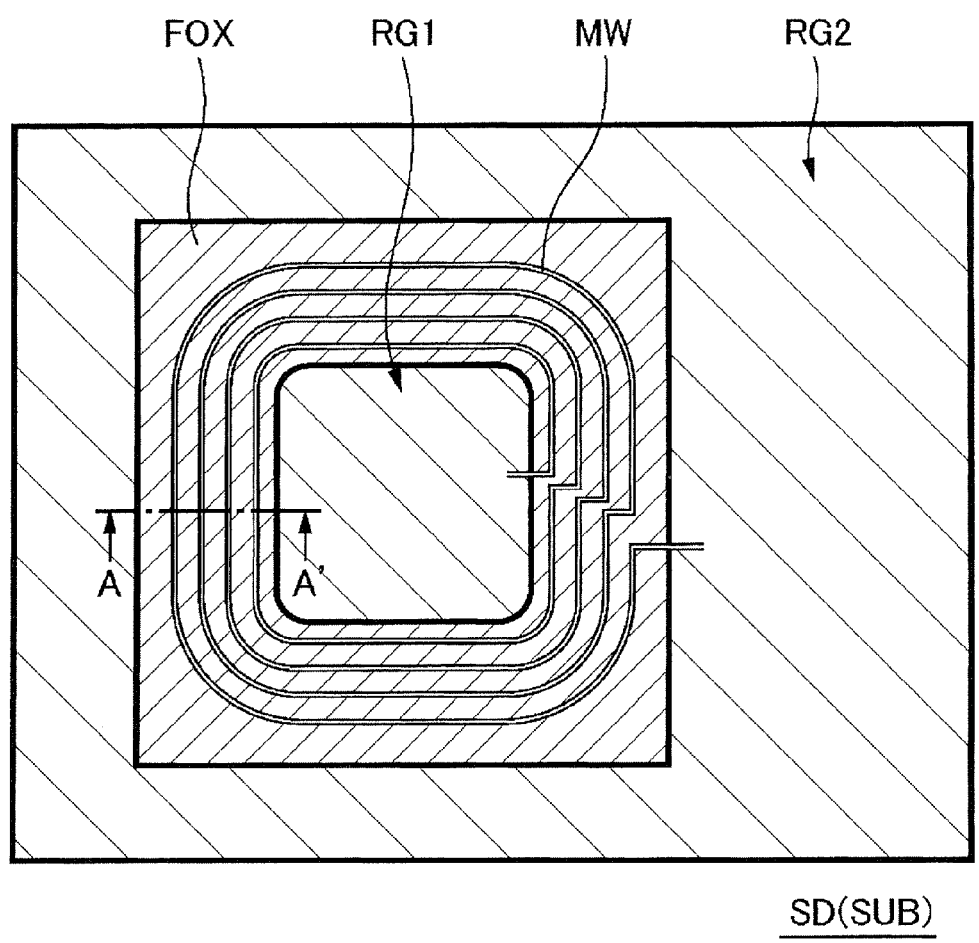
FIG. 1 is a plan view illustrating a configuration of a semiconductor device according to a first embodiment.

Preferred embodiments of the invention are to be described with reference to the drawings. Throughout the drawings, identical constitutional elements carry same reference numerals for which explanation is to be omitted optionally.

First Embodiment

Figure 2:
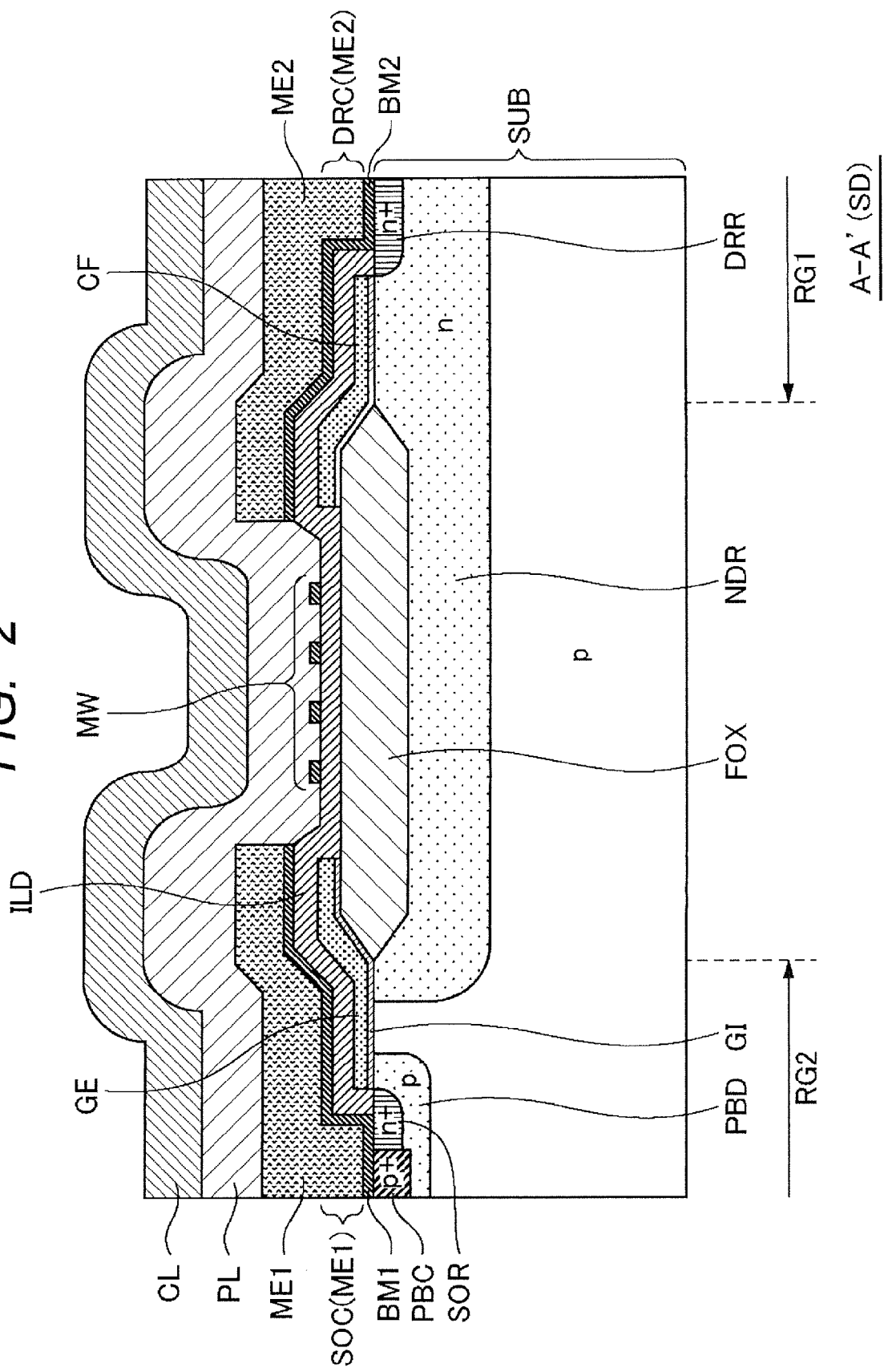
FIG. 2 is a cross sectional view along line A-A' in FIG. 1.

FIG. 1 is a plan view illustrating a configuration of a semiconductor device SD according to a first embodiment. FIG. 2 is a cross sectional view along line A-A' in FIG. 1.

As illustrated in FIG. 1, a semiconductor device SD has a first region RG1, a second region RG2, and a field oxide film FOS (field insulation film) in the substrate SUB. In the embodiment illustrated in the drawing, the field oxide film FOX has a planar rectangular shape having an opening in the inside. The first region RG1 is situated in the opening. Thus, the first region RG1 is surrounded by the field oxide film FOX in a plan view. In the embodiment illustrated in the drawing, the first region RG1 has a planar rectangular shape rounded at the corners. The second region RG2 is situated by way of the field oxide film FOX outside the first region RG1 in the plan view.

A metal interconnect MW is formed over the field oxide film FOX. In the embodiment illustrated in the drawing, the metal interconnect MW is repeatedly provided spirally in the direction along the edges of the first region RG1. The planer configuration of the metal interconnect MW is not restricted to that of the embodiment illustrated in the drawing. For example, the metal interconnect MW may also be repeatedly provided while being turned-back in the direction along the edges of the first region RG1.

As illustrated in FIG. 2, a semiconductor device SD has a first conduction type body region PBD, a second conduction type drift region NDR, and a field oxide film FOX in a substrate SUB. Further, the semiconductor device SD has a gate electrode GE, a conduction film CF, an interlayer dielectric film ILD, a metal interconnect MW, barrier metal films BM1 and BM2, metal electrodes ME1 and ME2, a protection film PL, and a cover film CL over the substrate SUB.

The first conduction type and the second conduction type may either be a p-type or an n-type so long as the conduction types are opposite each other. Description is to be made hereinafter that the first conduction type is the p-type and the second conduction type is the n-type.

The substrate SUB is, for example, a semiconductor substrate and, specifically, a silicon substrate or an SOI (Silicon on Insulator) substrate. In the embodiment illustrated in the drawing, the conduction type of the substrate SUB is a first conduction type (p-type). The conduction type of the substrate SUB may also be the second conduction type (n-type). In the embodiment illustrated in the drawing, while the first conduction type body region PBD and the second conduction type draft region NDR are formed in the substrate SUB, the structure of the semiconductor device SD is not restricted to the example illustrated in the drawing. For example, the first conduction type body region PBD and the second conduction type drift region NDR may also be formed to an epitaxial layer formed over the substrate SUB.

The first conduction type body region PBD is formed in the second region RG2. The first conduction type body region PBD includes a source region SOR and a first conduction type body contact region PBC. The source region SOR is an $n^+$ region (second conduction type region). The first conduction type body contact region PBC is a $p^+$ region (first conduction type region) having the impurity concentration higher than that of the first conduction type body region PBD. The source region SOR is situated on the side of the first region RG1 in contrast to the first conduction type body region PBD. On the other hand, the first conduction type body region PBD is situated on the side of the second region RG2 in contrast to the the source region SOR.

The second conduction type drift region NDR is situated on the side of the second region RG2 in contrast to the first conduction type body region PBD. The second conduction type drift region NDR is situated from the first region RG1 to the second region RG2. The second conduction type drift region NDR includes the field oxide film FOX in the surface layer and includes the drain region DRR on the side of the first region RG1 in contrast to the field oxide film FOX. The drain region DRR is an $n^+$ region (second conduction type region) having an impurity concentration higher than that of the second conduction type drift region NDR.

The gate electrode GE is situated over the substrate SUB and formed from the source region SOR to the field oxide film FOX in a plan view. The gate electrode GE is formed, for example, of polysilicon. A gate insulation film GI is situated between the gate electrode GE and the substrate SUB. The gate insulation GI is formed, for example, of a silicon oxide film ($SiO_2$).

The interlayer dielectric film ILD covers the substrate SUB and the field oxide film FOX. The interlayer dielectric film ILD is formed, for example, of a silicon oxide film ($SiO_2$). A source contact SOC and a drain contact DR are formed to the interlayer dielectric film. The source contact SOC penetrates the interlayer dielectric film ILD and is connected with the source region SOR. In the same manner, the drain contact DRC penetrates the interlayer dielectric film ILD and is connected with the drain region DRR. In the example illustrated in the drawing, the upper surface of the interlayer dielectric film ILD has a shape reflecting the unevenness from the surface of the substrate SUB to the surface of the field oxide film FOX. However, the upper surface of the interlayer dielectric film ILD may also be flat.

The metal interconnect MW is situated by way of the interlayer dielectric film ILD over the field oxide film FOX. The metal interconnect MW is formed of a high resistance metal. Specifically, the metal interconnect MW is formed of a metal having an electric resistivity at 25° C. of 40 $\mu\Omega\cdot$cm or more and 200 $\mu\Omega\cdot$cm or less. More specifically, the metal interconnect MW is formed, for example, of titanium, titanium nitride, tantalum, or tantalum nitride. However, the material of the metal interconnect MW is not restricted to the material described above. In this embodiment, the metal interconnect MW is a stacked film (TiN/Ti) formed by stacking titanium (Ti) and titanium nitride (TiN) in this order on the side of the interlayer dielectric film ILD.

As described above, the metal interconnect MW is repeatedly provided spirally in the direction along the edges of the first region RG1 in a plan view (FIG. 1). Further, the metal interconnect MW is electrically connected at the innermost circumference with the drain region DRR and is electrically connected at the outermost circumference to the source region SOR or a ground potential. In this embodiment, a voltage applied to the drain region DRR is higher than the voltage applied to the source region SOR. In this case, a current flows in the metal interconnect MW from the inner circumference (on the side of the drain region DRR) to the outer circumference (on the side of the source region SOR). In this case, potential on the metal interconnect MW gradually decreases from the inner circumference to the outer circumference. In this case, the electric field generated between the inner circumference and the outer circumference of the metal interconnect MW is substantially uniform.

The metal electrode ME1 is situated on the side of the second region RG2 in contrast to the metal interconnect MW in a plan view. On the other hand, the metal electrode ME2 is situated on the side of the first region RG1 in contrast to the metal interconnect MW in a plan view. The metal electrodes ME1 and ME2 cover the interlayer dielectric film ILD. The metal electrode ME1 is formed integrally with the source contact SOC and electrically connected with the source region SOR. On the other hand, the metal electrode MB2 is formed integrally with the drain contact DRC and electrically connected with the drain region DRR. The metal electrodes ME1 and ME2 are formed, for example, of aluminum (Al).

The barrier metal film BM1 is formed along the bottom and the lateral side of the source contact SOC and along the bottom of the metal electrode ME1. On the other hand, the barrier metal BM2 is formed along the bottom and the lateral side of the drain contact DPC and the bottom of the metal electrode ME2. The barrier metal films BM1 and BM2 are metal films for preventing the metal forming the metal electrode ME1 (for example, aluminum (Al) from diffusing to the interlayer dielectric film ILD or the substrate SUB (for example, the drain region DRR or the source region SOR). The barrier metal films BM1 and BM2 are formed of a material identical with that of the metal interconnect MW. In this embodiment, each of the barrier metal films BM1 and BM2 is a stacked film (TiN/Ti) formed by stacking titanium (Ti) and the titanium nitride (TiN) in this order from the interlayer dielectric film ILD.

A conduction film CF is situated over the substrate SUB, and formed from the drain region DRR to the field oxide film FOX in a plan view. The conduction film CF is formed of a material identical with that of the gate electrode GE (for example, polysilicon). The conduction film CF is electrically connected by way of a contact (not illustrated) that penetrates the metal electrode ME2 and the barrier metal film BM2 with the metal electrode ME2. In this case, a voltage applied to the drain region DRR is identical with the voltage applied to the conduction film CF. Thus, a portion of the conduction film CF riding over the field oxide film FOX serves as a field plate for moderating the electric field between the gate electrode GE and the drain region DRR.

A protection film PL covers the metal electrodes ME1 and ME2, and the metal interconnect MW. Further, in the example illustrated in the drawing, a cover film CL covers the protection film PL. The protection film PL is an insulation film for protecting, for example, the metal electrodes ME1 and ME2, and the metal interconnect MW from an external circumstance (for example, preventing the metal from oxidation). Specifically, the protection film PL is, for example, a silicon nitride film (SiN). On the other hand, the cover film CL is, for example, formed of PSG (Phospho Silicate Glass). Materials for the protection film PL and the cover film CL are not restricted to the examples described above.

The gate electrode GE, the metal electrode ME1, and the metal electrode ME2 are connected electrically with a first pad, a second pad, and a third pad (not illustrated) respectively. Such pads are formed, for example, over the protection film PL and are partially covered by the cover film CL. Then, by applying a voltage to the pads, a driving voltage is applied to the gate electrode GE, the source region SOR (metal electrode ME1) and the drain region DRR (metal electrode ME2).

FIG. 3 to FIG. 11 are cross sectional views illustrating a method of manufacturing the semiconductor device SD illustrated in FIG. 1 and FIG. 2.

Figure 3:
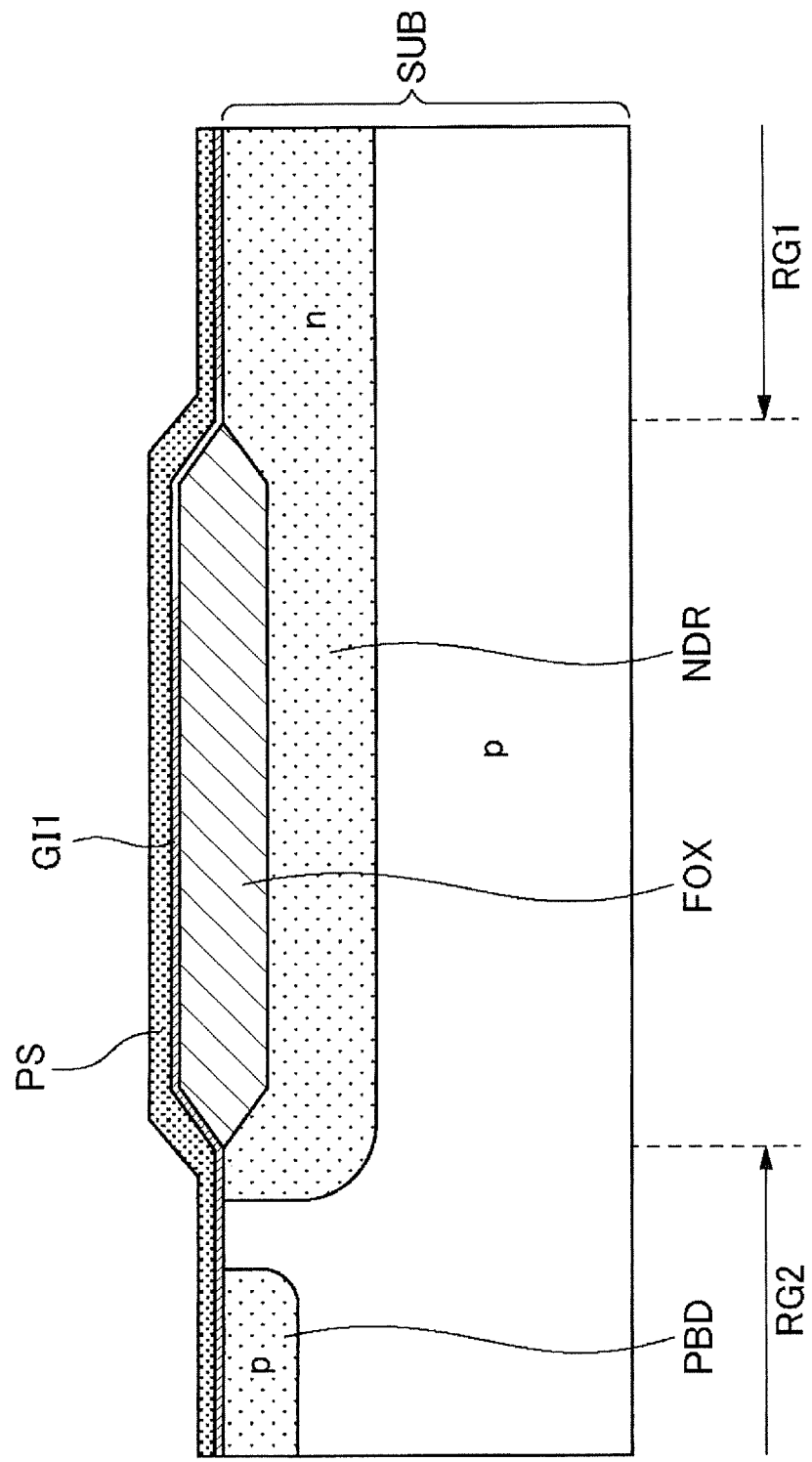
FIG. 3 is a cross sectional view illustrating a method of manufacturing the semiconductor device illustrated in FIG. 1 and FIG. 2.

First, as illustrated in FIG. 3, a first conduction type body region PBD and a second conduction type drift region NDR are formed to the surface of the substrate SUB by implanting ions into the substrate SUB. Then, a field oxide film FOX is formed over the surface of the substrate SUB. The field oxide film FOX is formed, for example, by LOCOS (Local Oxidation of Silicon) or STI (Shallow Trench Isolation). The order for the steps of forming the first conduction type body region PBD and the second conduction type drift region NDR, and the field oxide film FOX may be reversed. Then, a polysilicon film PS and an insulation film GI1 are formed in this order over the substrate SUB and the field oxide film FOX. The polysilicon film PS is a conduction film that forms the gate electrode GE and the conduction film CF. The insulation film GI1 is an insulation film that forms the gate insulation film GI.

Figure 4:
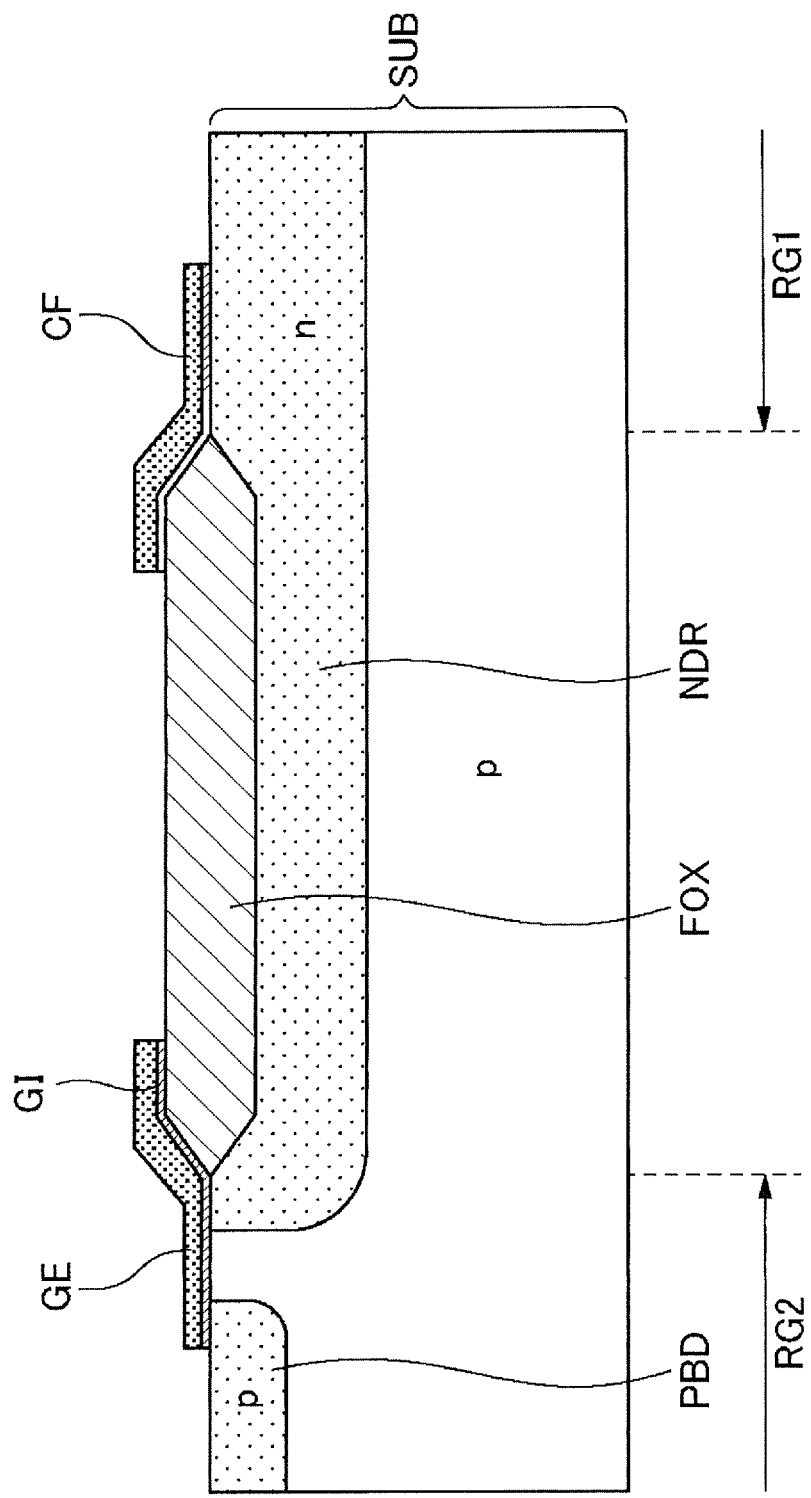
FIG. 4 is a cross sectional view illustrating the method of manufacturing the semiconductor device illustrated in FIG. 1 and FIG. 2.

Then, as illustrated in FIG. 4, the polysilicon film PS and the insulation film GI1 are patterned. Thus, a gate electrode GE and a conduction film CF are formed, and a gate insulation film GI is formed below the gate electrode GE and the conduction film CF.

Figure 5:
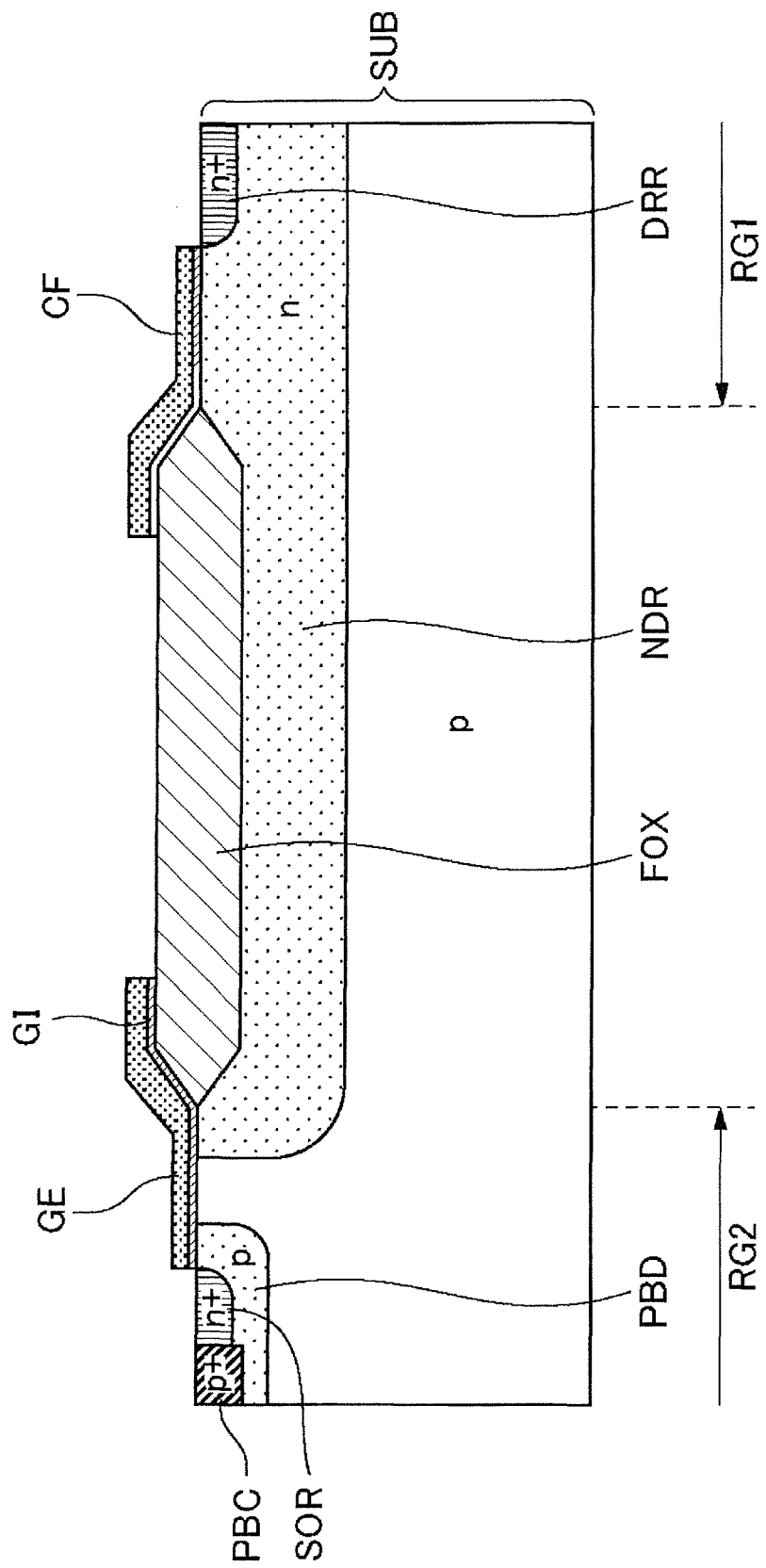
FIG. 5 is a cross sectional view illustrating the method of manufacturing the semiconductor device illustrated in FIG. 1 and FIG. 2.

Then, as illustrated in FIG. 5, ions are implanted into the substrate SUB, thereby forming a drain region DRR and a source region SOR, and forming the first conduction type body contact region PBC.

Figure 6:
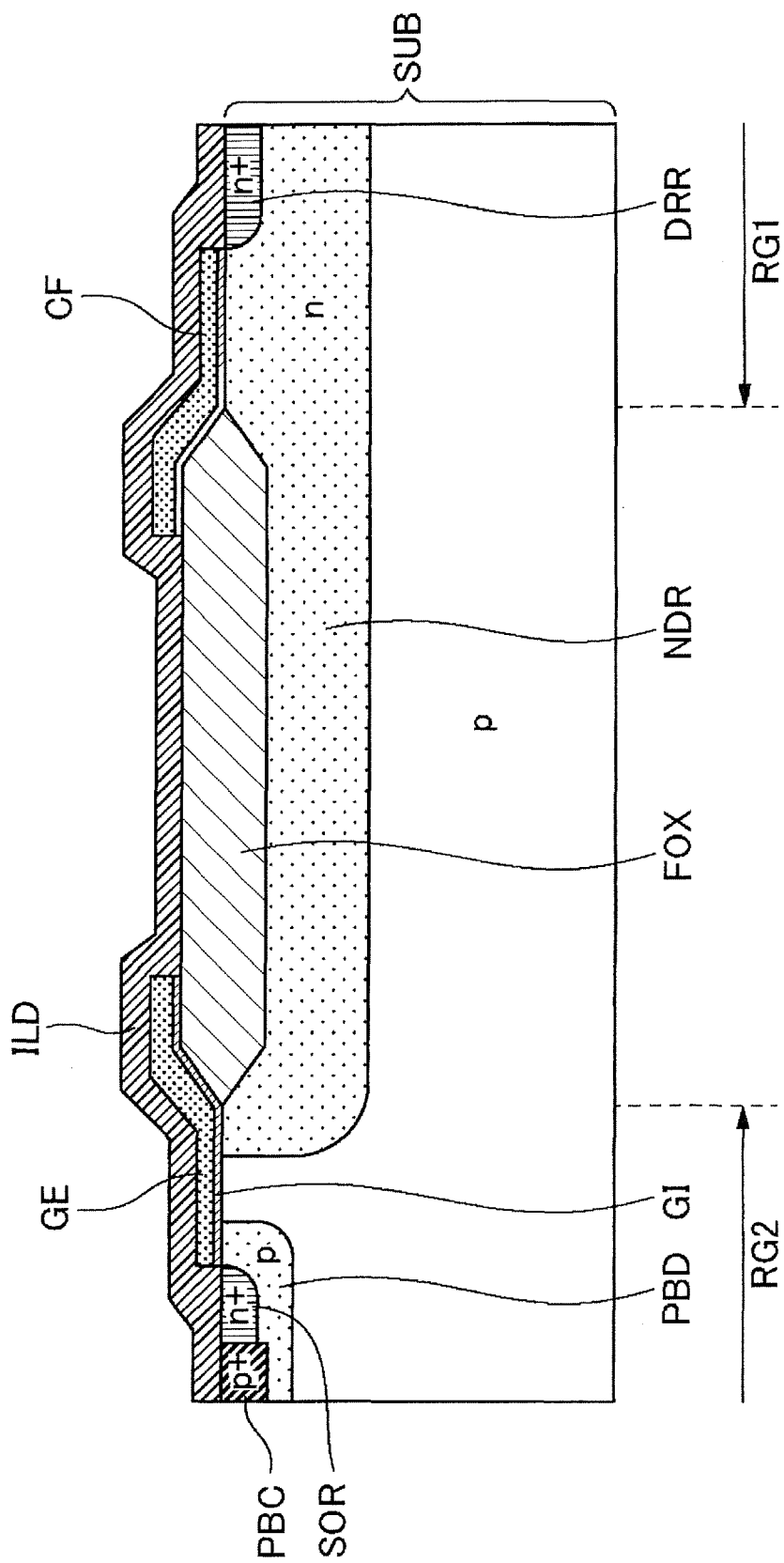
FIG. 6 is a cross sectional view illustrating the method of manufacturing the semiconductor device illustrated in FIG. 1 and FIG. 2.

Then, as illustrated in FIG. 6, an interlayer dielectric film ILD is formed over the substrate SUB, over the field oxide film FOX, over the gate electrode GE, and over the conduction film CF.

Figure 7:
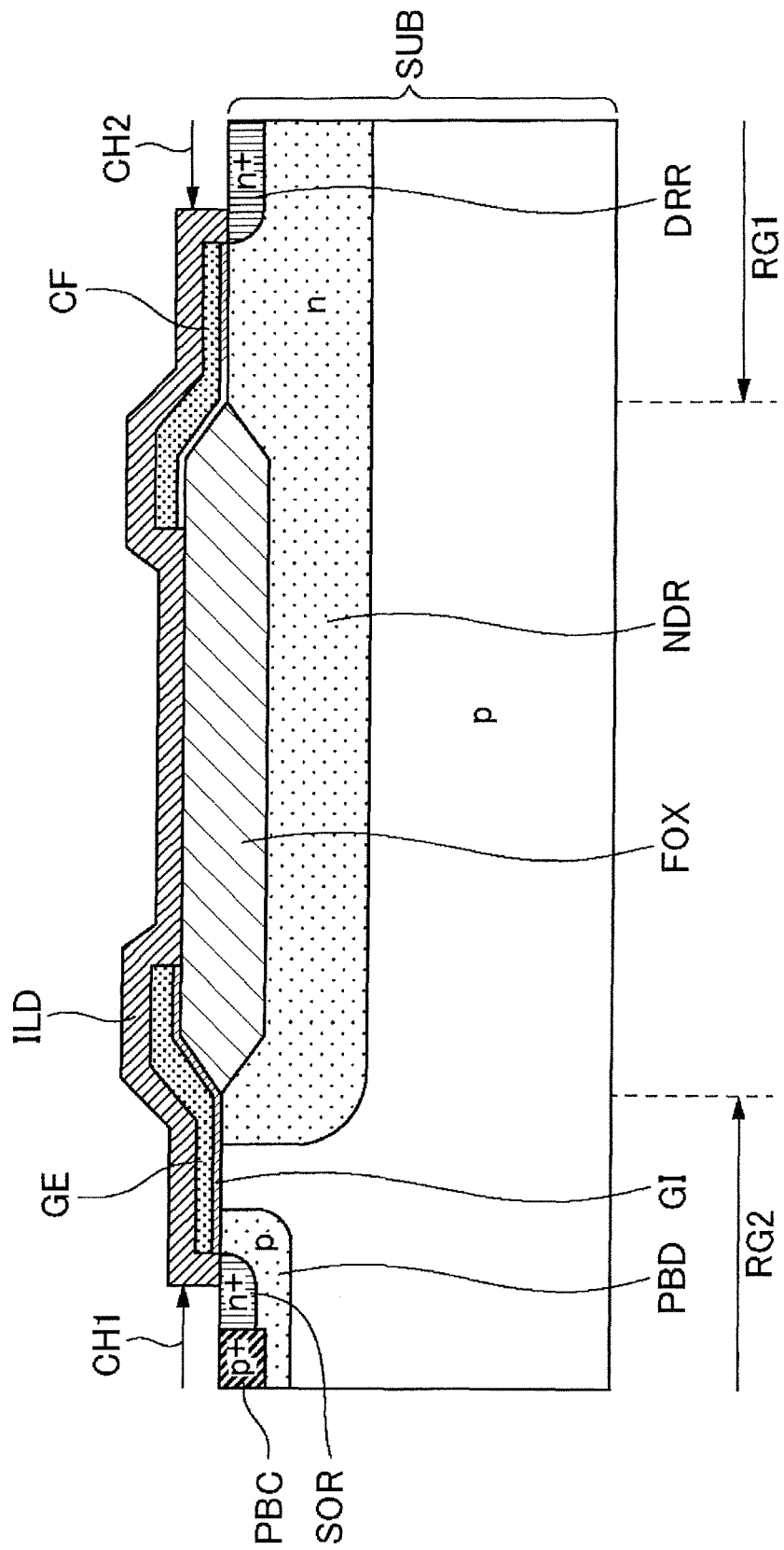
FIG. 7 is a cross sectional view illustrating the method of manufacturing the semiconductor device illustrated in FIG. 1 and FIG. 2.

Then, as illustrated in FIG. 7, connection holes CH1 and CH2 are formed in the interlayer dielectric film ILD. The connection holes CH1 and the connection hole CH2 penetrate the interlayer dielectric film ILD and reach the drain region DRR and the source region SOR respectively. As will be detailed later, a drain contact DRC and a source contact SOC are formed to the connection holes CH1 and connection hole CH2, respectively.

Figure 8:
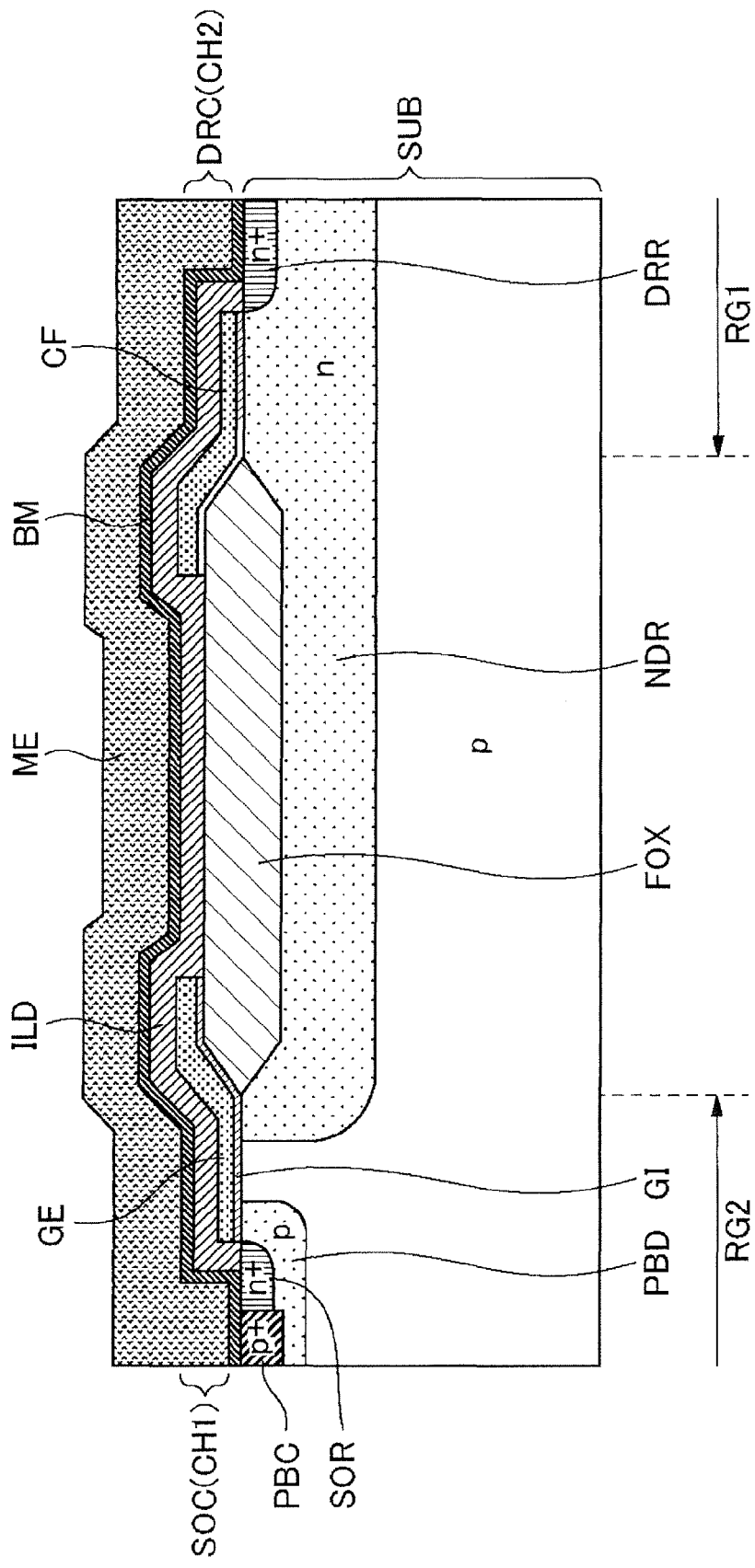
FIG. 8 is a cross sectional view illustrating the method of manufacturing the semiconductor device illustrated in FIG. 1 and FIG. 2.

Then, as illustrated in FIG. 8, a barrier metal film BM and a metal film ME are stacked in this order over the interlayer dielectric film ILD. Thus, the barrier metal film BM is formed along the bottoms and the lateral sides of the connection holes CH1 and CH2 and the upper surface of the interlayer dielectric film ILD. On the other hand, the metal film ME fills the connection holes CH1 and CH2 to form a drain contact DRC and a source contact SOC. Further, the metal film ME is formed by way of the barrier metal BM along the upper surface of the interlayer dielectric film ILD. The barrier metal film BM and the metal film ME are formed, for example, by sputtering.

As will be described specifically later, the barrier metal film BM is a metal film that forms barrier metal films BM1 and BM2 and the metal interconnect MW. The metal film ME is a metal film that forms metal electrodes ME1 and ME2. In this embodiment, the barrier metal film BM is a stacked film (TiN/Ti) formed by stacking titanium (Ti) and titanium nitride (TiN) in this order from the side of the interlayer dielectric film ILD. On the other hand, metal film ME is formed of aluminum (Al). However, the materials for the barrier metal film BM and the metal film ME are not restricted to those described above.

Figure 9:
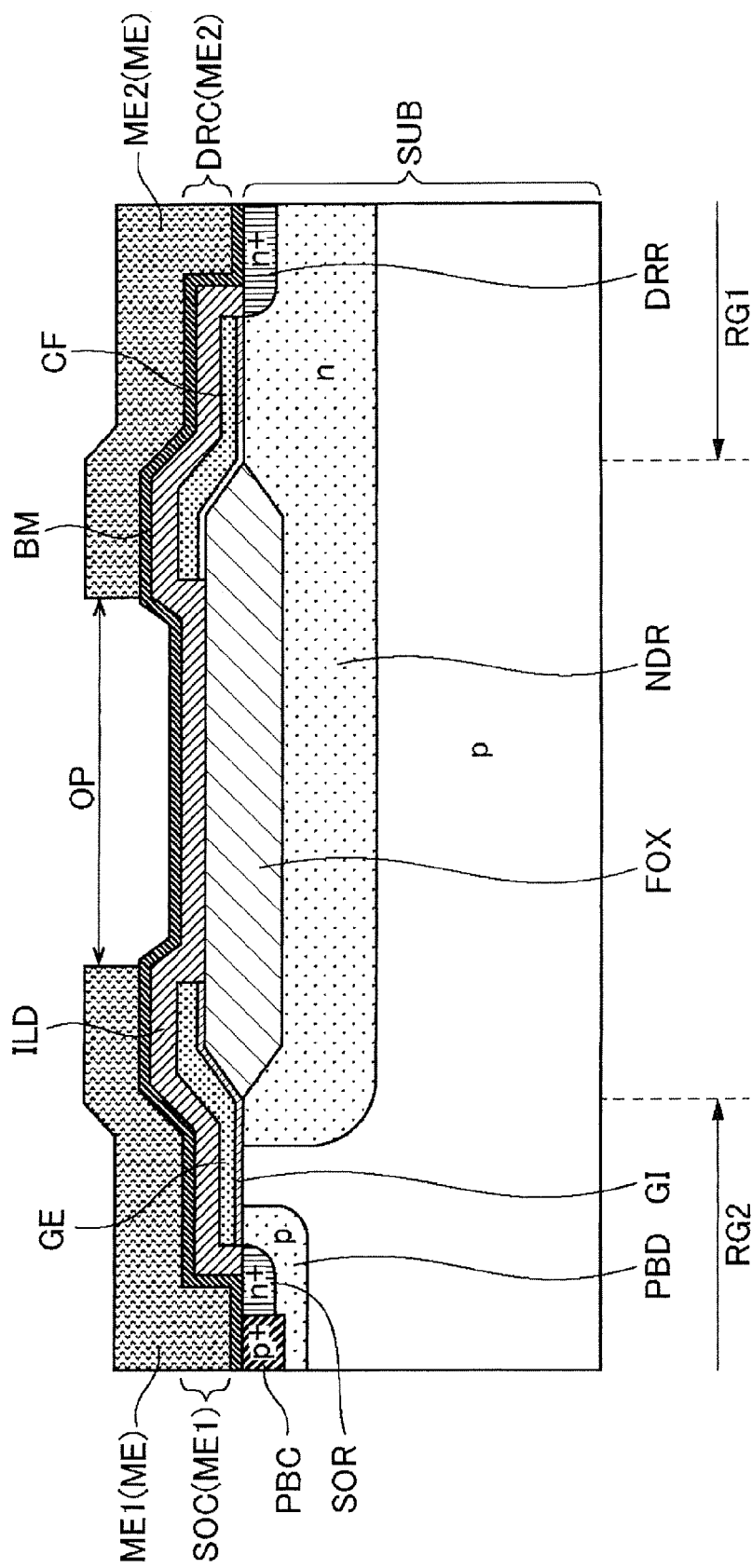
FIG. 9 is a cross sectional view illustrating the method of manufacturing the semiconductor device illustrated in FIG. 1 and FIG. 2.

Then, as illustrated in FIG. 9, the metal film ME is patterned, thereby forming an opening OP in the metal film ME over the field oxide film FOX. Thus, the metal film ME forms a metal electrode ME1 on the side of the second region RG2 in contrast to the opening OP in a plan view, and forms a metal electrode ME2 on the side of the first region RG1 in contrast to the opening OP in the plan view. In this step, the metal film ME situated in the region where the opening OP is formed is removed, for example, by reactive ion etching (RIE).

More specifically, the etching rate of the metal film ME according to this embodiment is different from that of the barrier metal film BM (particularly, upper surface of the barrier metal film BM). Accordingly, in the step illustrated in the drawing, the metal film ME can be removed selectively in contrast to the barrier metal film BM. However, the surface layer of the barrier metal film BM is also removed depending on etching conditions. In this case, the thickness of the barrier metal film BM in the region where the opening OP is situated is less than the thickness of the barrier metal film BM situated below the metal electrodes ME1 and ME2.

Figure 10:
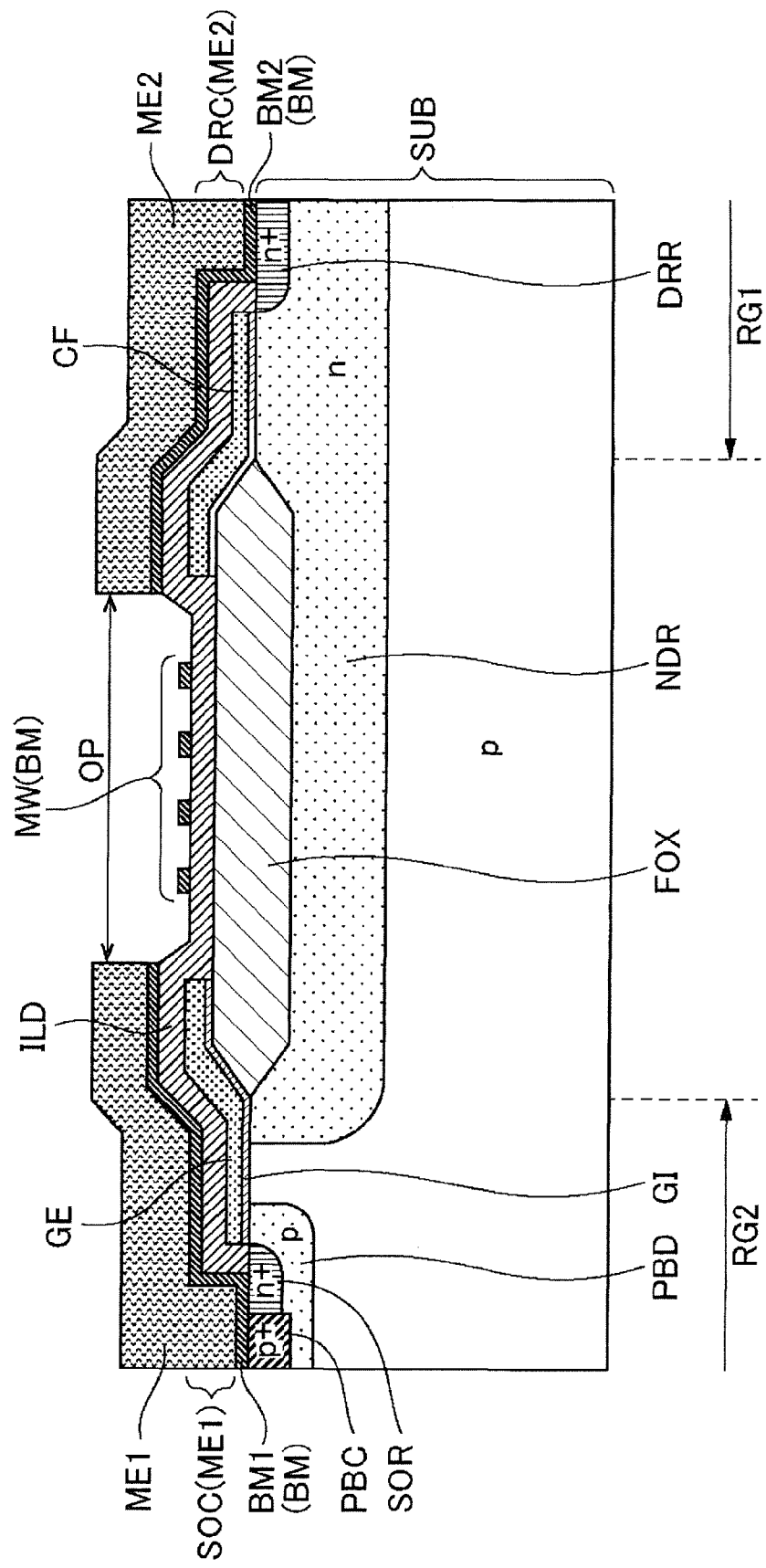
FIG. 10 is a cross sectional view illustrating the method of manufacturing the semiconductor device illustrated in FIG. 1 and FIG. 2.

Then, as illustrated in FIG. 10, the barrier metal film BM situated inside the opening OP in a plan view is patterned, thereby forming a metal interconnect MW. In this step, the barrier metal film BM to be removed by patterning is removed, for example, by RIE. When the thickness of the barrier metal film BM in the region where the opening OP is situated is less than the thickness of the barrier metal film BM situated below the metal electrodes ME1 and ME2 as described above, the thickness of the metal interconnect MW is less than the thickness of the barrier metal film situated below the metal electrodes ME1 and ME2.

Figure 11:
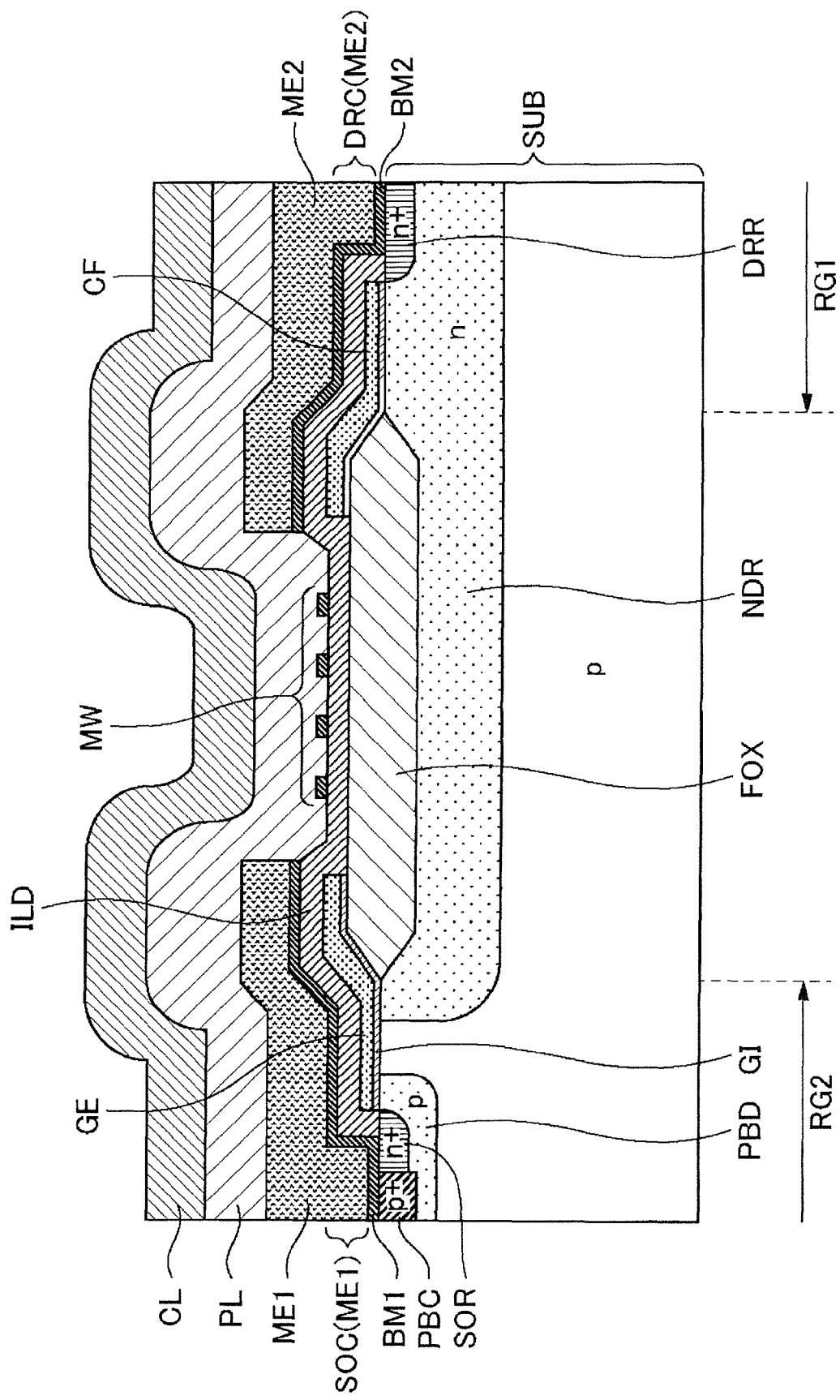
FIG. 11 is a cross sectional view illustrating the method of manufacturing the semiconductor device illustrated in FIG. 1 and FIG. 2.

Then, as illustrated in FIG. 11, a protection film PL and a cover film CL are stacked in this order over the metal electrodes ME1 and ME2 and over the metal interconnect MW. Thus, the semiconductor device SD illustrated in FIG. 1 and FIG. 2 is manufactured.

As described above, according to this embodiment, the metal interconnect MW is formed by way of the interlayer dielectric film ILD over the field oxide film FOX. The metal interconnect MW is repeatedly provided spirally in the direction along the edges of the first region RG1 in a plan view. The metal interconnect MW is electrically connected at the innermost circumference with the drain region DRR and is electrically connected at the outermost circumference with the source region or the ground potential. Accordingly, when a high voltage is applied to the drain region DRR and a low voltage is applied to the source region SOR, a substantially uniform electric field is generated between the inner circumference (on the side of the drain region DRR) and the outer circumference (on the side of the source region SOR) of the metal interconnect MW. Thus, concentration of the electric field to a region between the high voltage side (on the side of the drain region DRR) and the low voltage side (on the side of the source region SOR) can be suppressed.

Particularly, according to this embodiment, the protection film PL is formed over the metal electrodes ME1 and ME2 and over the metal interconnect MW. When the protection film PL is a silicon nitride (SiN) film, the metal interconnect MW functions particularly effectively. Specifically, the silicon nitride film (protection film PL) has a lot of dangling bonds at the upper surface and the upper surface tends to absorb moisture. Accordingly, negative charges tend to be trapped to the upper surface of the silicon nitride film. Then, when the negative charges are trapped to the silicon nitride film, the negative charges may sometimes form a depletion layer below the field oxide film FOX. Such depletion layer may possibly fluctuate characteristics of the semiconductor device SD. On the contrary, in this embodiment, a substantially uniform electric field is generated by the metal interconnect MW. In this case, the electric field caused by the negative charges can be moderated by the electric field of the metal interconnect MW. Thus, fluctuation of the characteristics of the semiconductor device SD can be suppressed.

Further, according to this embodiment, the metal interconnect MW is formed of a high resistance metal. Accordingly, less current flows in the metal interconnect MW. Thus, a current flowing by way of the metal interconnect MW from the high voltage side (on the side of the drain region DRR) to the low voltage side (on the side of the source region SOR) by way of the metal interconnect MW can be restricted.

Further, according to this embodiment, the metal interconnect MW is formed by using the barrier metal film BM (barrier metal films BM1 and BM2) (for example, as illustrated in FIG. 10). Accordingly, in this embodiment, the metal interconnect MW can be formed efficiently.

Second Embodiment

Figure 12:
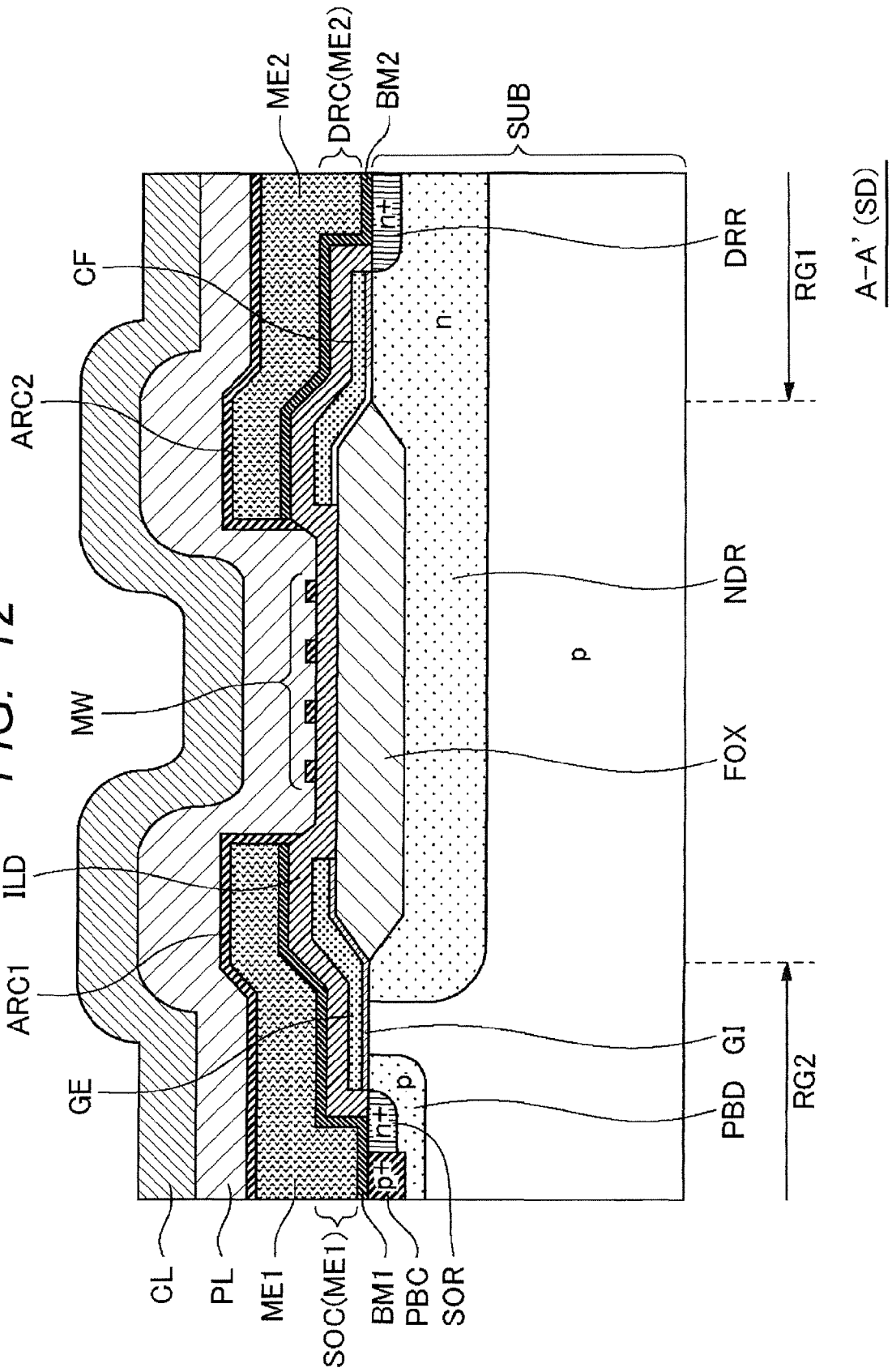
FIG. 12 is a cross sectional view illustrating the configuration of a semiconductor device according to second embodiment.

FIG. 12 is a cross sectional view illustrating a configuration of a semiconductor device SD according to a second embodiment, and corresponds to FIG. 2 for the first embodiment. The semiconductor device SD according to this embodiment has a configuration similar to that of the semiconductor devices SD according to the first embodiment except for the followings.

In this embodiment, like the first embodiment, the metal electrode ME1 is situated on the side of the second region RG2 in contrast to the metal interconnect MW, and covers the interlayer dielectric film ILD. On the other hand, the metal electrode ME2 is situated on the side of the first region RG1 in contrast to the metal interconnect MW and covers the interlayer dielectric film ILD. The metal electrode ME1 is covered with an anti-reflection film ARC1. Also, the metal electrode ME2 is covered with an anti-reflection film ARC2. As will be described specifically latter, the anti-reflection films ARC1 and ARC2 are metal films for preventing occurrence of halation upon lithography for forming the metal electrodes ME1 and ME2. The metal interconnect MW is formed of a material identical with that of the anti-reflection films ARC1 and ARC2. The anti-reflection films ARC1 and ARC2 are covered by a protection film PL and a cover film CL.

FIG. 13 to FIG. 16 are cross sectional views illustrating a method of manufacturing the semiconductor device SD illustrated in FIG. 12. First, steps illustrated in FIG. 3 to FIG. 8 are performed in the same manner as in the first embodiment.

Figure 13:
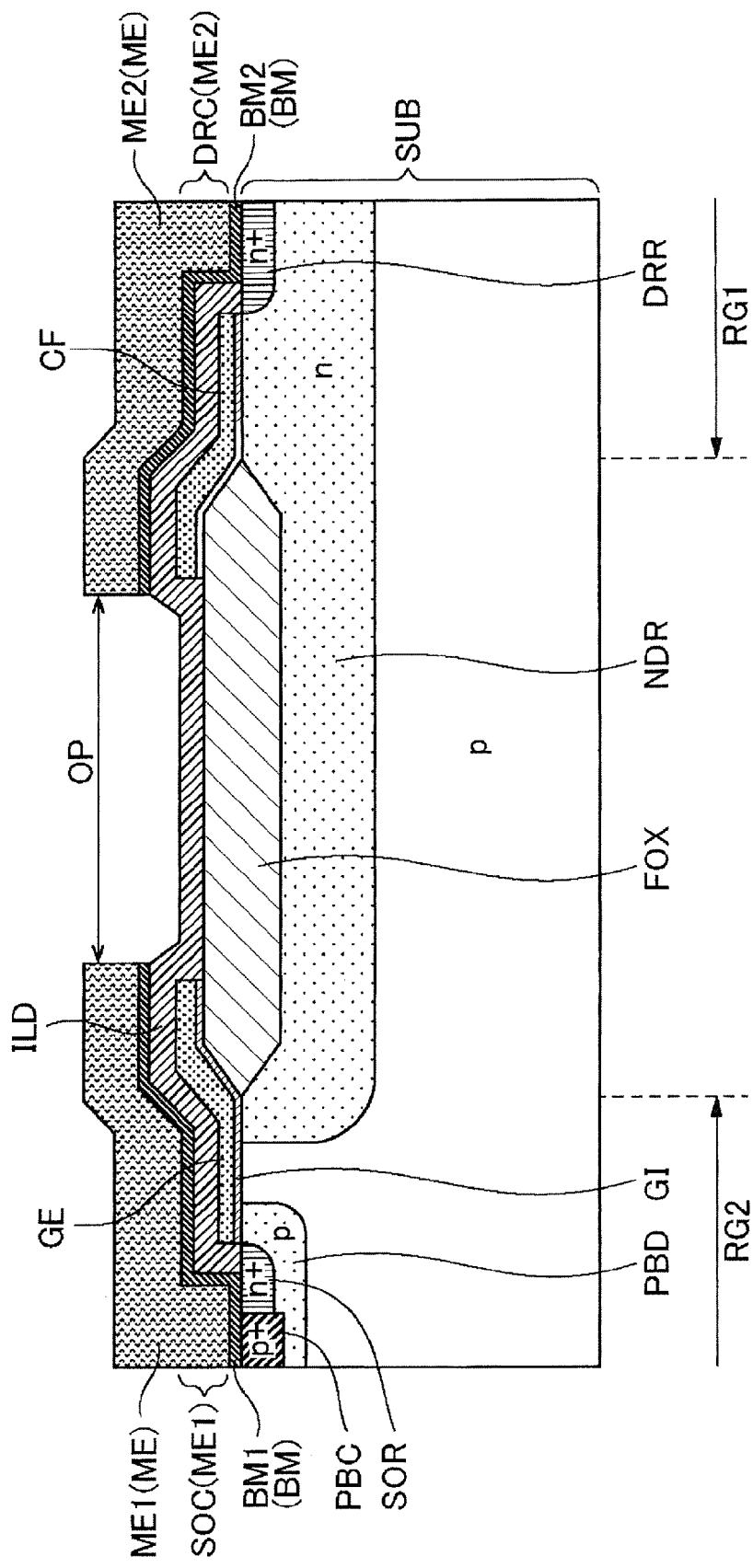
FIG. 13 is a cross sectional view illustrating a method of manufacturing the semiconductor device illustrated in FIG. 12.

Then, as illustrated in FIG. 13, the metal film ME and the barrier metal film BM are patterned, thereby forming an opening OP in the metal film ME and the barrier metal film BM over the field oxide film FOX. Thus, the metal film ME forms a metal electrode ME1 on the side of the first region RG1 in contrast to the opening OP in a plan view and forms a metal electrode ME2 on the side of the second region RG2 in contrast to the opening OP in the plan view. On the other hand, the barrier metal film BM forms a barrier metal film BM1 on the side of the first region RG1 in contrast to the opening OP in the plan view and forms a barrier metal film BM2 on the side of the second region RG2 in contrast to the opening OP in the plan view.

Figure 14:
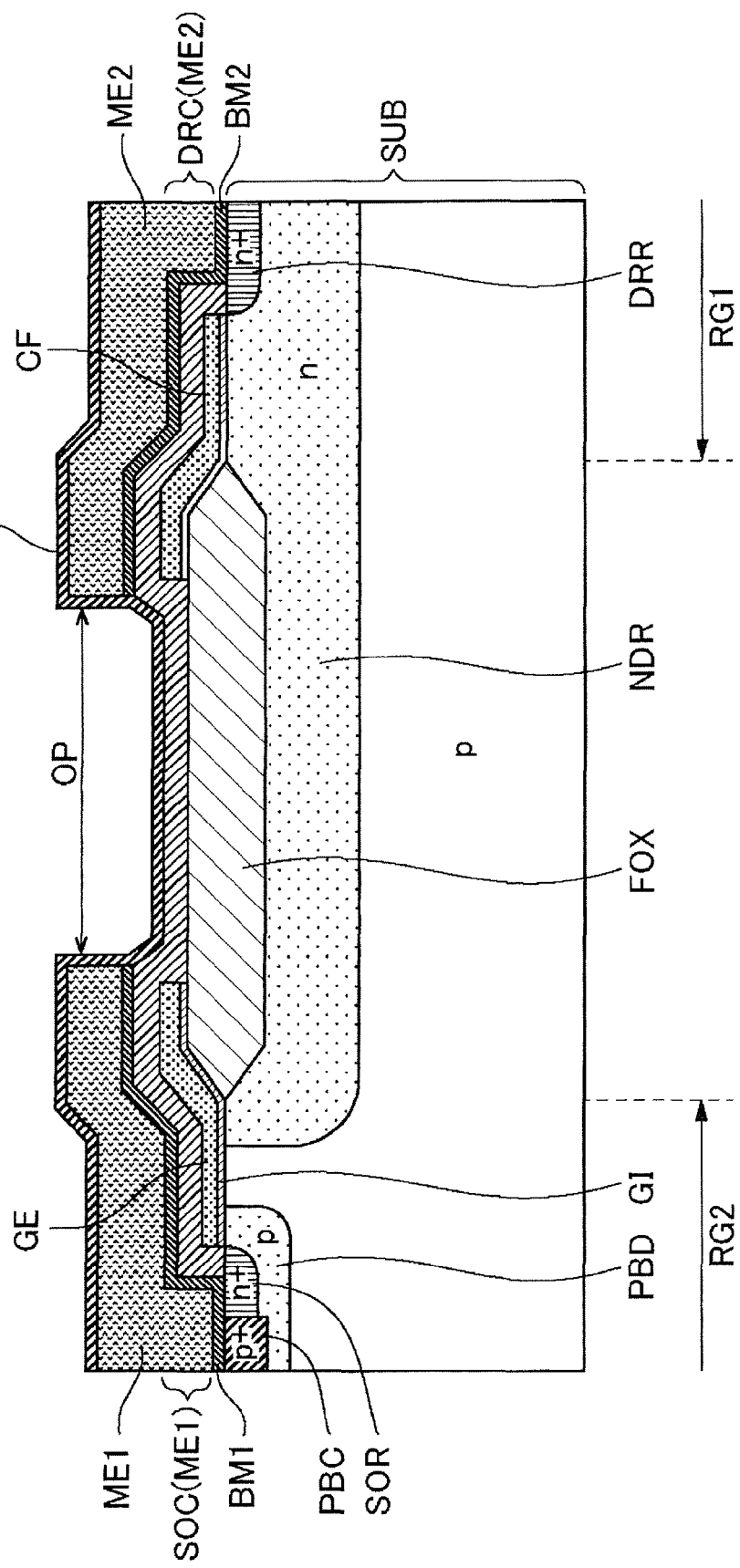
FIG. 14 is a cross sectional view illustrating the method of manufacturing the semiconductor device illustrated in FIG. 12.

Then, as illustrated in FIG. 14, an anti-reflection film ARC is formed, for example, by sputtering. Thus, the anti-reflection film ARC is formed along the bottom and the lateral sides of the opening OP and the upper surface of the metal electrodes ME1 and ME2. The thickness of the anti-reflection film ARC is substantially identical in any of the regions. As will be described specifically latter, the anti-reflection film ARC is a metal film that forms a metal interconnect MW. In this embodiment, the anti-reflection film ARC comprises titanium nitride (TiN). However, the material of the anti-reflection film ARC is not restricted to titanium nitride.

Figure 15:
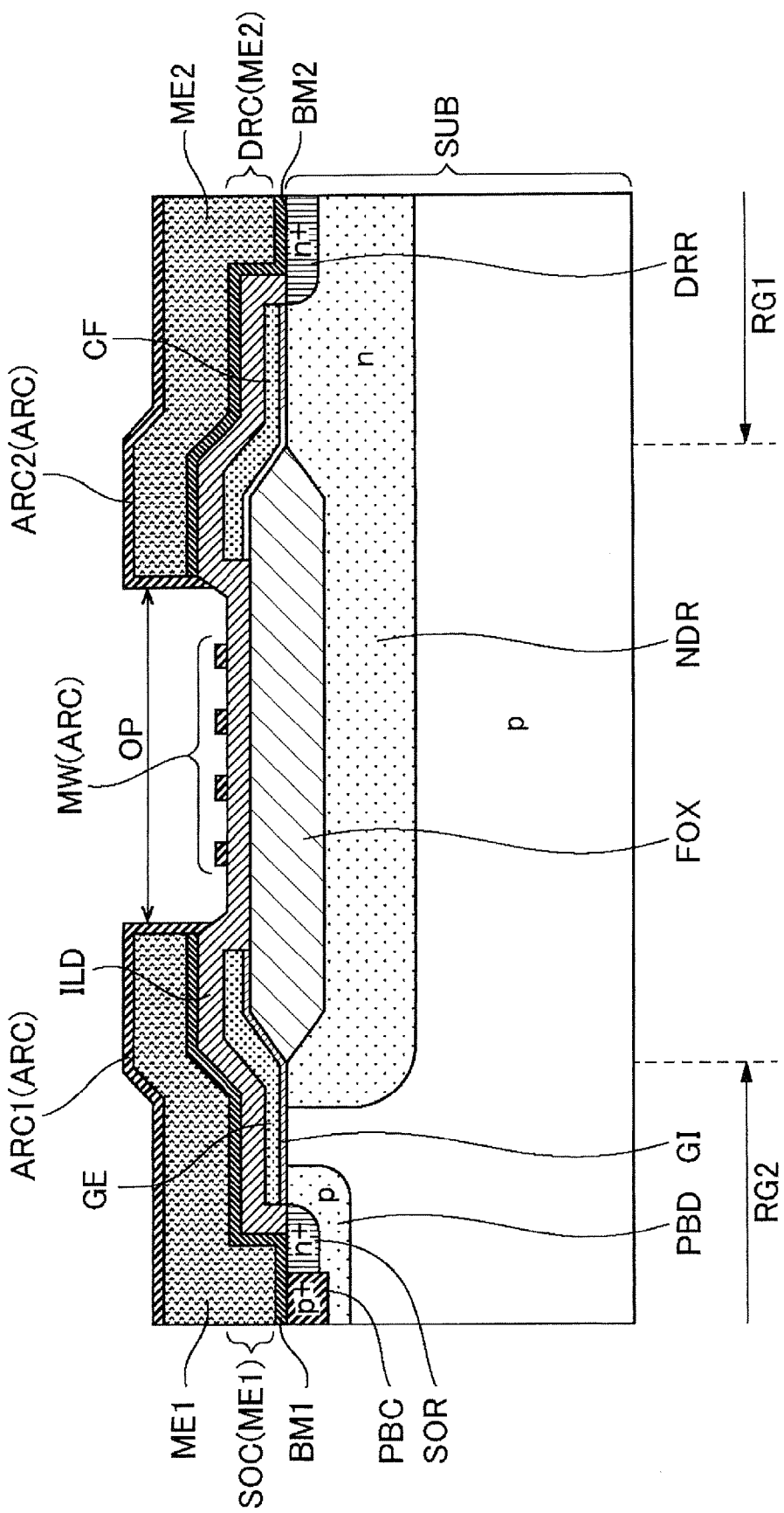
FIG. 15 is a cross sectional view illustrating the method of manufacturing the semiconductor device illustrated in FIG. 12.

Then, as illustrated in FIG. 15, the anti-reflection film ARC is patterned. Thus, a metal interconnect MW is formed inside of the opening OP in a plan view and, concurrently, anti-reflection films ARC1 and ARC2 are formed over the metal electrodes ME1 and ME2 respectively. When the thickness of the anti-reflection film ARC is substantially identical in any of the regions, the thickness of the metal interconnect MW is substantially identical with that of the anti-reflection films ARC1 and ARC2. Halation may sometimes occur by the reflection of light at the metal electrodes ME1 and ME2 in lithography for forming the metal interconnect MW. The anti-reflection film ARC (anti-reflection films ARC1, and ARC2) functions as a metal film for suppressing such halation.

Figure 16:
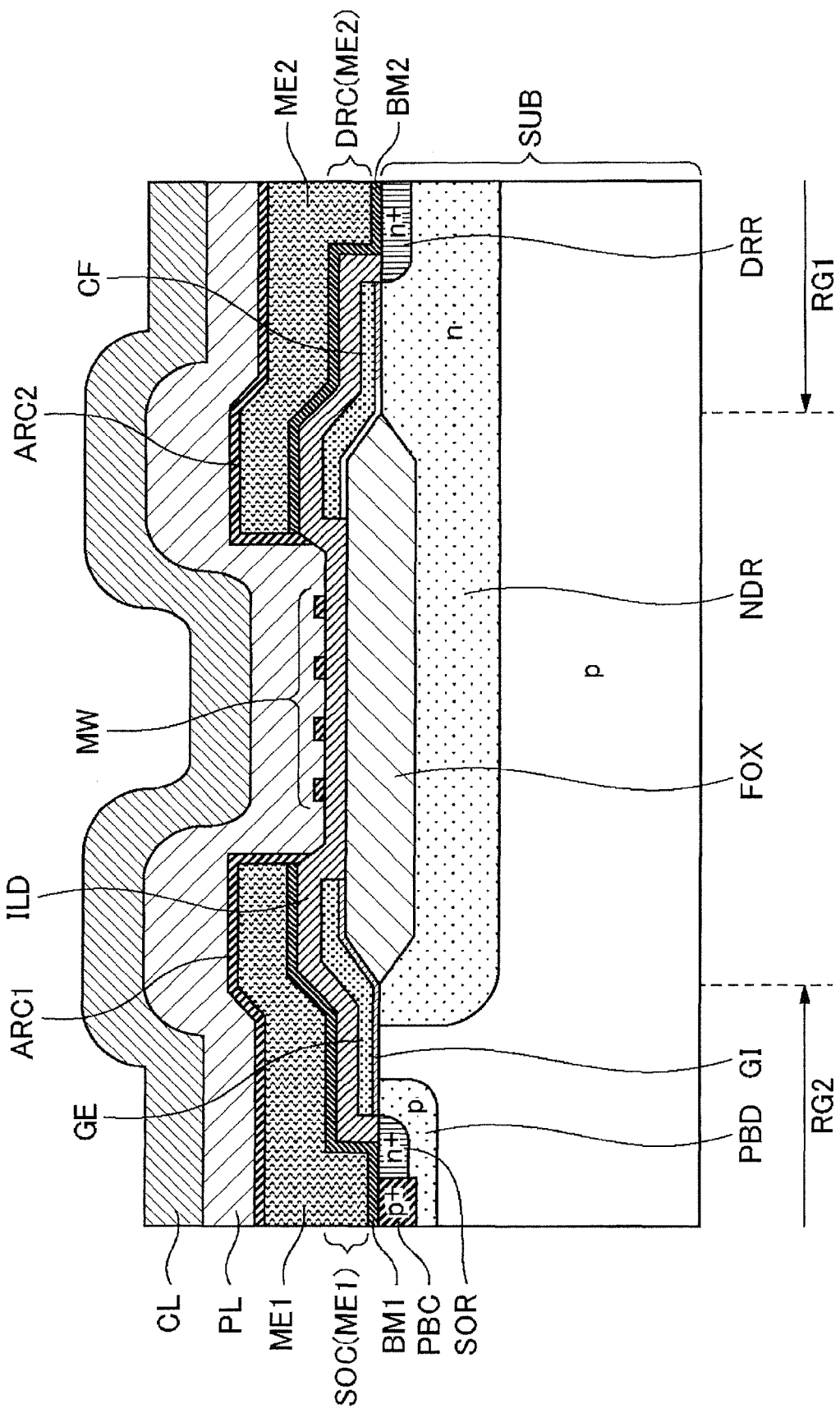
FIG. 16 is a cross sectional view illustrating the method of manufacturing the semiconductor device illustrated in FIG. 12.

Then, as illustrated in FIG. 16, a protection film PL and a cover film CL are stacked in this order over the anti-reflection films ARC1 and ARC2 and over the metal interconnect MW. Thus, the semiconductor device SD illustrated in FIG. 12 is manufactured.

As described above, according to this embodiment, an electric field between the high voltage side (on the side of the drain region DRR) and the low voltage side (on the side of the source region SOR) can be moderated by the metal interconnect MW. Further, according to this embodiment, the metal interconnect MW is formed by using the anti-reflection film ARC (anti-reflection films ARC1 and ARC2) (for example, as illustrated in FIG. 15). Accordingly, the metal interconnect MW can be formed efficiently in this embodiment.

Modified Embodiment

Figure 17:
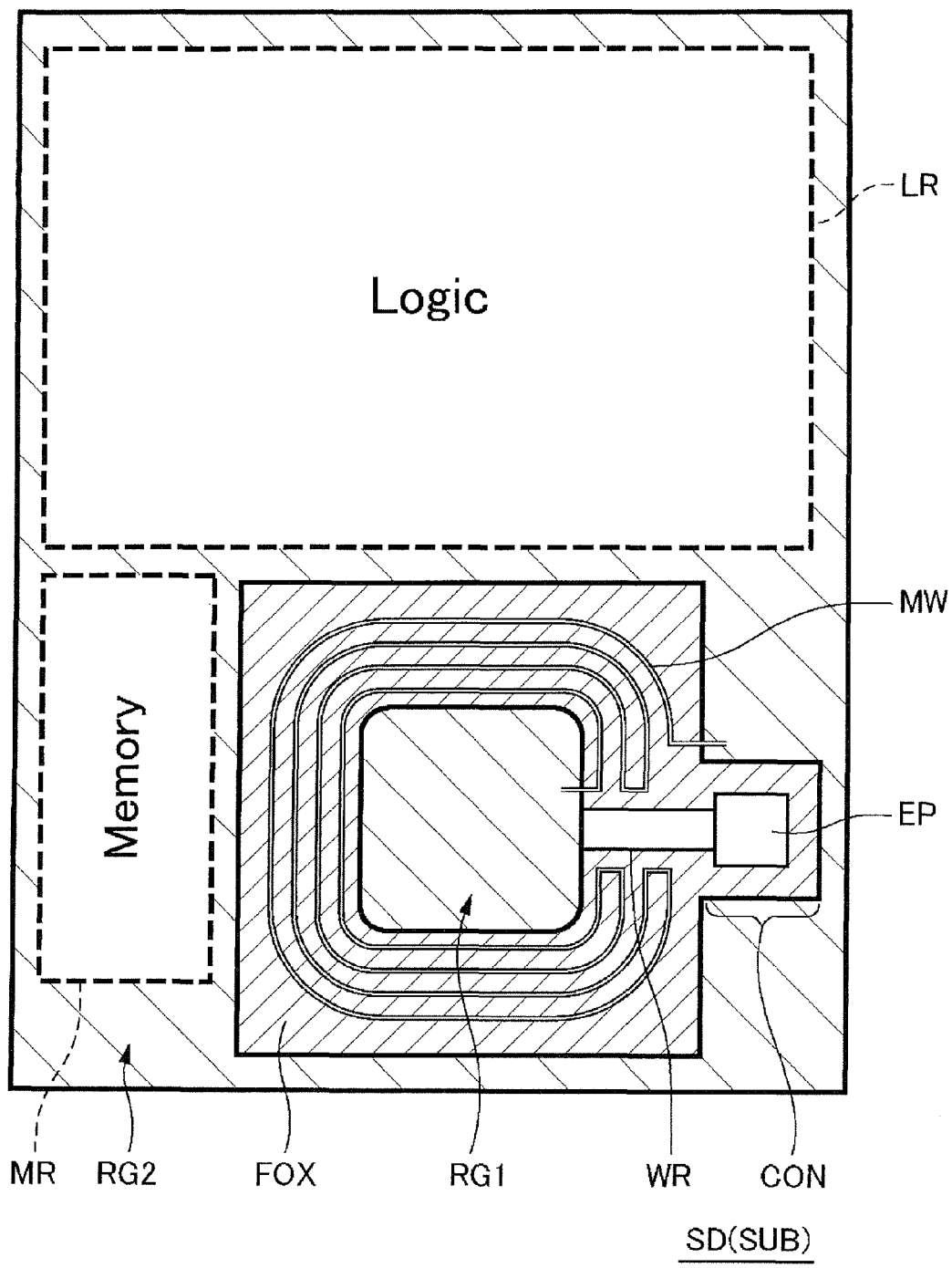
FIG. 17 is a plan view illustrating a configuration of a semiconductor device according to a modified embodiment.

FIG. 17 is a plan view illustrating the configuration of a semiconductor device SD according to a modified embodiment. In the embodiment illustrated in the drawing, a field oxide film FOX has a planar shape having a protrusion CON protruding from one side of a rectangle. An electrode pad EP is arranged over the protrusion portion CON. Further, an interconnect WR is formed over the field oxide film FOX. The interconnect WR extends from a first region RG1 to a second region RG2. The interconnect WR electrically connects the electrode pad EP and the drain electrode DRR (for example, illustrated in FIG. 2 of FIG. 12). That is, a driving voltage for the drain region DRR is applied to the electrode pad EP.

The interconnect WR is formed, for example, of a material identical with that of the metal electrodes ME1 and ME2 (for example, the metal film ME illustrated in FIG. 9 or FIG. 13). That is, the interconnect WR is formed concurrently with the metal electrodes ME1 and ME2 by using the metal film ME (for example, as illustrated in FIG. 9 or FIG. 13). Further, a barrier metal film BM is situated below the interconnect WR (for example, as in FIG. 9), or an anti-reflection film ARC is situated over the interconnect WR (for example, as illustrated in FIG. 13).

When the interconnect WR is situated over the field oxide film FOX as described above, the metal interconnect MW cannot be provided in a region overlapping the interconnect WR in a plan view. In this case, as illustrated in the drawing, the metal interconnect MW can be repeatedly provided while being turned back so as not to overlap the interconnect WR in the plan view. Also in this case, an electric field between the high voltage side (on the side of the first region RG1) and the low voltage side (on the side of the second region RG2) can be made substantially uniform in the same manner as in the first embodiment or in the second embodiment.

Further, in the embodiment illustrated in the drawing, a withstand voltage between the first region RG1 (high voltage region) and the second region RG2 (low voltage region) is made high by the field oxide film FOX and the metal interconnect MW. Accordingly, a memory region MR and a logic region LR can be arranged in a region adjacent with the field oxide film FOX in a plan view. More specifically, in the embodiment illustrated in the drawing, the planar configuration of the field oxide film FOX has a rectangular shape having a protrusion CON described above on one side. Then, a memory region MR and a logic region LR are formed along the sides of the field oxide film FOX different from the one side described above. Even when the memory region MR and the logic region LR are arranged near the high voltage region (first region RG1), the memory region MR and the logic region LR are protected against the high voltage by the field oxide film FOX and the metal interconnect MW.

Examples of reference embodiments are to be described additionally.

1. A method of manufacturing a semiconductor device including the step of:
   forming a field insulation film over a substrate thereby forming a first region surrounded by the field insulation film in a plan view, a second region situated outside the first region by way of the field insulation film in a plan view,
   forming a drain region of a transistor in the first region and, concurrently, forming a source region of the transistor in the second region,
   forming an interlayer dielectric film covering the substrate, the field insulation film, and the transistor,
   forming a barrier metal film over the interlayer dielectric film,
   forming a metal film over the barrier metal film,
   forming an opening in the metal film over the field insulation film,
   patterning the barrier metal film situated inside the opening in the plan view, thereby forming a metal interconnect repeatedly provided being turned back or spirally in the direction along the edges of the first region.

2. A method of manufacturing a semiconductor device including the steps of:
   forming a field insulation film to a substrate, thereby forming a first region surrounded by the field insulation film in a plan view and a second region situated outside the first region by way of the field insulation film in the plan view,
   forming a drain region of a transistor in the first region and, concurrently, forming a source region of the transistor in the second region,
   forming an interlayer dielectric film covering the substrate, the field insulation film, and the transistor, in the second region,
   forming a metal film over the interlayer dielectric film,
   forming an opening in the metal film over the field insulation film,
   forming an anti-reflection film which is a metal film covering the metal film and the interlayer dielectric film situated inside the opening in the plan view, and
   patterning the anti-reflection film situated inside the opening in the plan view, thereby forming a metal interconnect repeatedly provided being turned back or spirally in the direction along the edges of the first region.

The inventions made by the present inventors have been described specifically with reference to the preferred embodiments but it will be apparent to a person skilled in the art that the present invention is not restricted to the preferred embodiments described above but can be modified variously within a range not departing the gist of the invention.

What is claimed is:

1. A semiconductor device including
a substrate,
a transistor formed in the substrate,
a first region formed in the substrate and including a drain region of the transistor,
a field insulation film formed in the substrate and surrounding the first region in a plan view,
a second region formed in the substrate, situated outside the first region by way of the field insulation film in the plan view and including a source region of the transistor, and
a metal interconnect situated over the field insulation film, wherein
the metal interconnect is formed of a metal having an electric resistivity at 25° C. of 40 μΩ·cm or more and 200 μΩ·cm or less, and repeatedly provided while being turned back or spirally in the direction along the edges of the first region, electrically connected at the innermost circumference with the drain region, and electrically connected at the outermost circumference with the source region or a ground potential.

2. The semiconductor device according to claim 1,
further including an interconnect situated over the field insulation film and extending from the first region to the second region in which the metal interconnect is repeatedly provided while being turned back so as not to overlap the interconnect in a plan view.

3. The semiconductor device according to claim 2,
further including an electrode pad situated over the field insulation film in which the interconnect electrically connects the electrode pad and the drain region.

4. The semiconductor device according to claim 1,
wherein the metal interconnect is formed of titanium, titanium nitride, tantalum, or tantalum nitride.

5. A semiconductor device including:
a substrate,
a transistor formed in the substrate,
a first region formed in the substrate and including a drain region of the transistor,
a field insulation film formed in the substrate and surrounding the first region in a plan view,
a second region formed in the substrate, situated outside the first region by way of the field insulation film in the plan view and including a source region of the transistor,
an interlayer dielectric film covering the substrate, the transistor, and the field insulation film,
a metal interconnect situated by way of the interlayer dielectric film over the field insulation film,
a first metal electrode situated on the side of the first region in contrast to the metal interconnect in the plan view, covering the interconnect dielectric film, and electrically connected with the drain region,
a second metal electrode situated on the side of the second region side in contrast to the metal interconnect in the plan view, covering the interlayer dielectric film and electrically connected with the source region, and a barrier metal layer formed along the bottom of the first metal electrode and the bottom of the second metal electrode, wherein
the metal interconnect is repeatedly provided being turned back or spirally in a direction along the edges of the first region, electrically connected at the innermost circumference with the drain region and electrically connected at the outermost circumference with the source region or the ground potential, and formed of a material identical with that of the barrier metal film.

6. The semiconductor device according to claim 5,
further including an interconnect situated over the field insulation film and extending from the first region to the second region in which the metal interconnect is repeatedly provided while being turned back so as not to overlap the interconnect in a plan view.

7. The semiconductor device according to claim 6,
further including an electrode pad situated over the field insulation film in which the interconnect electrically connects the electrode pad and the drain region.

8. The semiconductor device according to claim 5,
wherein the metal interconnect is formed of titanium, titanium nitride, tantalum, or tantalum nitride.

9. A semiconductor device including:
a substrate,
a transistor formed in the substrate,
a first region formed in the substrate and including a drain region of the transistor,
a field insulation film formed in the substrate and surrounding the first region in a plan view,
a second region formed in the substrate, situated to the outside the first region by way of the field insulation film in the plan view and including a source region of the transistor,
an interlayer dielectric film covering the substrate, the transistor, and the field insulation film,
a metal interconnect situated by way of the interlayer dielectric film over the field insulation film,
a first metal electrode situated on the side of the first region in contrast to the metal interconnect in the plan view, covering the interlayer dielectric film and electrically connected with the drain region,
a second metal electrode situated on the side of the second region in contrast to the metal interconnect in the plan view, covering the interlayer dielectric film, and electrically connected with the source region, and
an anti-reflection film which is a metal film covering the first metal electrode and the second metal electrode,
wherein the metal interconnect is repeatedly provided while being turned back or spirally in the direction along the edges of the first region, electrically connected at the innermost circumference with the drain region and electrically connected at the outermost circumference with the source region or a ground potential and formed of a material identical with that of the anti-reflection film.

10. The semiconductor device according to claim 9,
further including an interconnect situated over the field insulation film and extending from the first region to the second region, in which the metal interconnect is repeatedly provided while being turned back so as not to overlap the interconnect in a plan view.

11. The semiconductor device according to claim 10
further including an electrode pad situated over the field insulation film in which the interconnect electrically connects the electrode pad and the drain region.

12. The semiconductor device according to claim 11,
wherein the metal interconnect is formed of titanium, titanium nitride, tantalum, or tantalum nitride.

* * * * *